(12) United States Patent
Shimizu et al.

(10) Patent No.: US 6,645,873 B2
(45) Date of Patent: Nov. 11, 2003

(54) METHOD FOR MANUFACTURING A SEMICONDUCTOR DEVICE

(75) Inventors: Akira Shimizu, Tama (JP); Fumitoshi Ozaki, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/881,255

(22) Filed: Jun. 14, 2001

(65) Prior Publication Data

US 2002/0013062 A1 Jan. 31, 2002

(30) Foreign Application Priority Data

Jun. 21, 2000 (JP) ........................................ 2000-186645
Jun. 26, 2000 (JP) ........................................ 2000-190620
Aug. 1, 2000 (JP) ........................................ 2000-233585

(51) Int. Cl.[7] ............................................. H01L 21/302
(52) U.S. Cl. ........................................ 438/714; 438/723
(58) Field of Search ................................. 438/706, 714, 438/723, 743, 745

(56) References Cited

U.S. PATENT DOCUMENTS

| 5,174,855 A | * | 12/1992 | Tanaka ...................... 134/102.1 |
| 5,489,553 A | * | 2/1996 | Chen ............................. 134/11 |
| 5,973,371 A |   | 10/1999 | Kasai ........................... 257/382 |
| 6,103,568 A | * | 8/2000 | Fujiwara ....................... 438/253 |
| 6,117,763 A | * | 9/2000 | May et al. .................... 438/622 |

OTHER PUBLICATIONS

"Gas–phase Selective Etching of Native Oxide" published in IEEE Transaction on Electron Device, vol. 37, No. 1 pp. 107–115 (1990).

* cited by examiner

Primary Examiner—Kin-Chan Chen
(74) Attorney, Agent, or Firm—Knobbe Martens Olson & Bear, LLP

(57) ABSTRACT

A method of processing a semiconductor substrate involves etching a SiOF layer with HF or HF+$H_2O$. The method can be used to form hollow structures in semiconductor substrates and thus provides a way to make interlayer insulators.

12 Claims, 3 Drawing Sheets

METHOD FOR MANUFACTURING A SEMICONDUCTOR DEVICE

BACKGROUND OF THE INVENTION

1. Field of the Invention

This invention relates to methods of manufacturing semiconductor devices and particularly relates to methods that involve selectively etching a sacrificial film, preferably a fluorine-containing silicon oxide film (hereinafter referred to as "SiOF"). Preferred embodiments relate to methods of forming a hollow structure that functions as an interlayer insulator by selectively etching a sacrificial film.

2. Description of the Related Art

In recent years, semiconductor devices have become faster and more highly integrated and resistance-capacitance (RC) coupling delays have become a large factor in signal processing time. RC delays can be decreased by reducing wiring capacitance. One way to do this is to use low dielectric constant materials such as fluorine-doped $SiO_2$, porous $SiO_2$, an organic film or a porous film, etc. However, these materials have not been put to practical use because of problems such as processing difficulty and insufficient heat-resistance, which can increase the complexity of the process and lower device reliability. In addition, the dielectric constant values of these materials are 3.4 to 3.8, which are not likely to be sufficient to meet the specifications of future semiconductor devices.

In the case of conventional techniques for obtaining a low dielectric constant by forming a hollow structure or a void using an SiO film, there is a problem that, if a via hole is opened without being aligned with an interconnection in a lower layer, the opening passes through the hollow and a material filling up the via hole flows into the hollow, causing a connection failure at the via hole. There is an additional problem that the height of the hollow increases and that the hollow is exposed during a process of polishing an interlayer insulator by CMP (Chemical Mechanical Polishing), causing an interconnection in an upper layer to break or to short-circuit.

As semiconductor devices have become more integrated, etching methods have been changing over from wet etching to vapor-phase etching in order to reduce contamination. Typically, vapor-phase etching involves two processes, removing an oxide film (typically applied as a pretreatment during a process such as covering a contact hole or forming a gate electrode film), then selectively etching one of several spontaneously formed oxides.

There is a technique for obtaining a low dielectric constant by creating a hollow between interconnections by selective etching. In the selective etching process, to obtain selectivity with a non-doped silicon oxidation film (hereinafter referred to as "NSG"), a phosphorus-doped oxidation film (hereinafter referred to as "PSG") or a boronphosphorus-doped oxidation film (hereinafter referred to as "BPSG"), etc. is used. Selective etching, in principle, takes place by two chemical reactions shown as follows:

$$SiO_2(P_2O_5) + 4HF \rightarrow SiF_4 + 2H_2O \quad (I)$$

$$P_2O_5 + 3H_2O \rightarrow 2H_3PO_4 \quad (II)$$

Reaction (I) takes place at an early stage when BPSG is etched by HF and reaction (II) is a phosphoric acid formation reaction which subsequently takes place. $H_2O$ formed by the chemical reaction (I) and $P_2O_5$ contained in PSG or BPSG causes the chemical reaction (II), forming a phosphoric acid layer. Since HF is effectively ionized only in the phosphoric acid layer, PSG or BPSG is selectively etched. This method, however, has a problem: HF remains on a semiconductor substrate after etching because phosphoric acid formed by reaction (II) contains a small amount of HF and the vapor pressure is low. As a result, NSG is etched by absorbing moisture from the air when taking the semiconductor substrate out from a device. To prevent NSG from being etched, the semiconductor substrate is rinsed with pure water promptly after etching is completed. This, however, increases the number of steps and lowers process stability.

HF is much more selective in the absence of $H_2O$. When water adheres onto other oxidation films or metal films exposed inside a reaction chamber, etching takes place by reacting with HF gas, resulting in lower etch selectivity. As a result, wire breakage or short-circuits in multilayer interconnections can occur, lowering yield. It has been reported that PSG formed on a thermal oxidation film can be selectively removed by controlling the moisture concentration in HF gas to be within the range of 0.1 ppm or less, see "Gas-phase Selective Etching of Native Oxide" published in Transaction on Electron Device, Vol. 37, No.1 (1990). However, lower process stability and higher costs are likely because of the difficulty of supplying HF with a low $H_2O$ content and in order to remove moisture formed by the etching reaction and adhering to an inner wall of the etching chamber.

SUMMARY OF THE INVENTION

This invention provides a method of processing a semiconductor substrate, which involves selective etching, without etching NSG and using a spontaneously oxidized film with high selectivity. This invention also provides a method of processing a semiconductor substrate, which performs selective etching without increasing the number of processes, while maintaining high process stability. Furthermore, this invention also provides a method of processing a semiconductor substrate, which can remove a spontaneous oxidation film and carry out selective etching in one device. Thus, a preferred embodiment provides a method of processing a semiconductor substrate, comprising: providing a semiconductor substrate disposed within a chamber, wherein the semiconductor substrate comprises a SiOF film and at least one other film, and selectively etching the SiOF film with a gas comprising HF.

This invention also provides a method of producing a hollow structure in a semiconductor device, forming an interlayer insulator with a dielectric constant approaching one, by performing selective etching using an oxidation film with high selectivity. This invention also provides a method of producing a hollow structure in a semiconductor device while maintaining high process stability by performing selective etching without leaving a residue and without increasing the number of processes. This invention also provides a selective etching method which brings about high selectivity by controlling the moisture concentration inside a reaction chamber. Thus, a preferred embodiment provides a method of producing a hollow structure in a semiconductor device, comprising: forming a first SiOF layer on a first interconnection; forming a first cap layer on the first SiOF layer; forming a first contact hole passing through the first cap layer and the first SiOF layer; forming a first contact plug by filling the first contact hole; and selectively etching the first SiOF layer to form a hollow structure.

Figure 1:
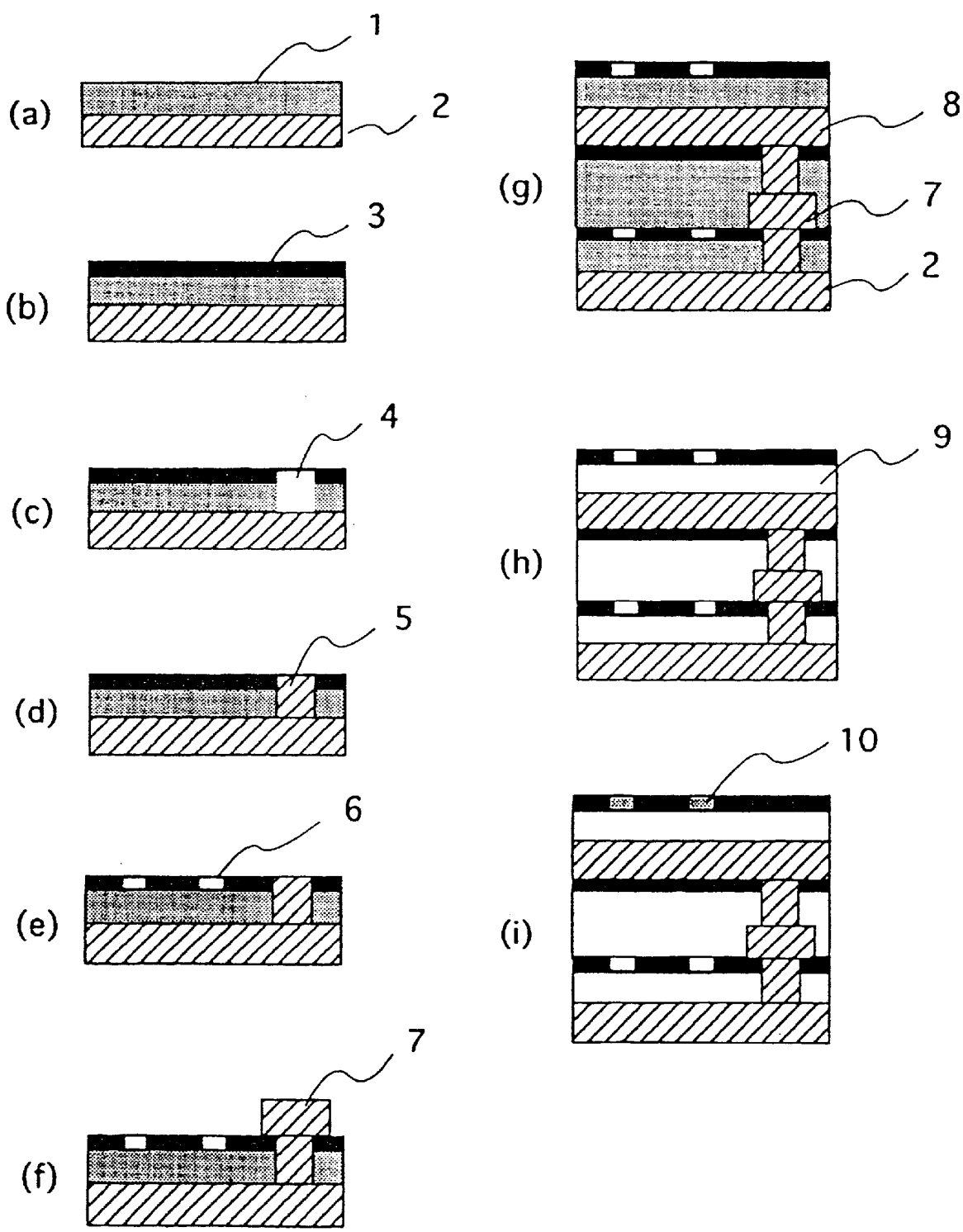
FIGS. 1(a) to (i) are cross sections of a preferred embodiment illustrating a method for producing a hollow structure in a semiconductor device.
Figure 2:
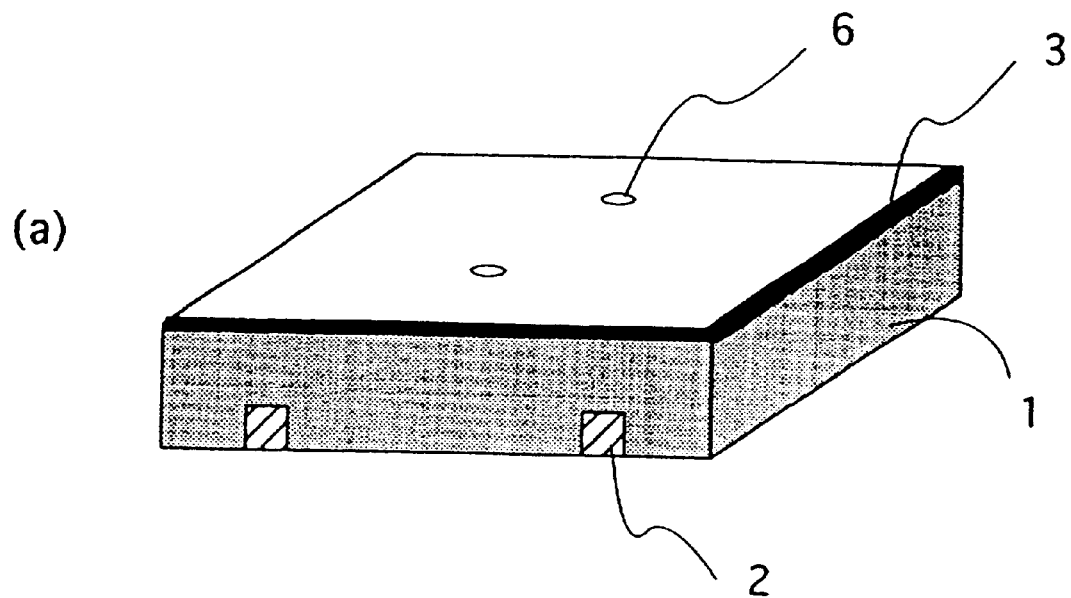
FIG. 2(a) is a three-dimensional view of the positional relation of the opening 6 and the lower interconnection 2 in FIG. 1(e).
FIG. 2(b) is a schematic cross section of a multilayer interconnection using a hollow structure as an interlayer insulator, which is formed by a method according to the present invention. On each layer of the multilayer interconnection, a hollow structure 9 is formed as an interlayer insulator and the dielectric constant value between the interconnections infinitely approaches one.
Figure 2:
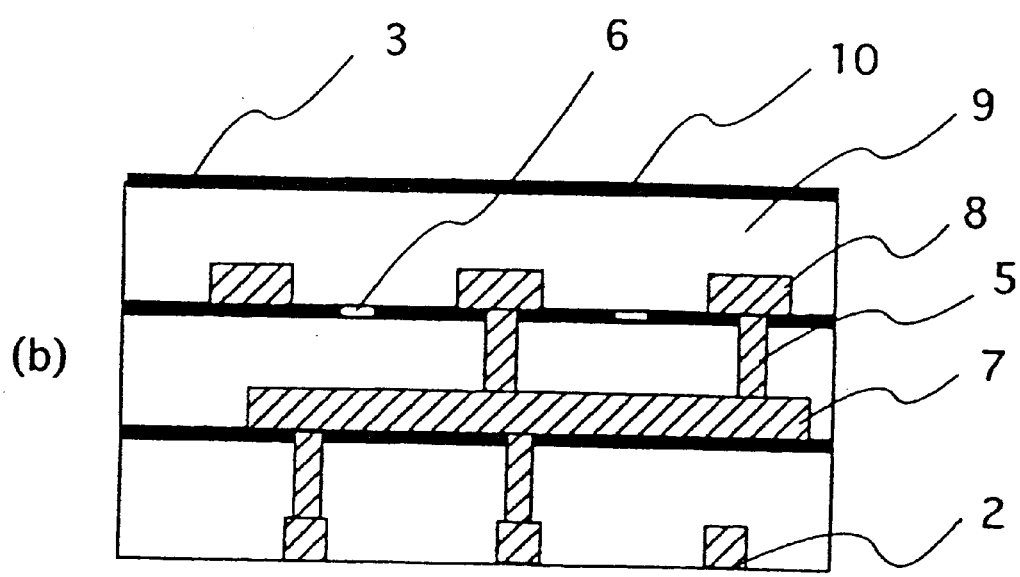

The figure references used in FIGS. 1–2 are SiOF film 1, Interconnection 2, Cap film 3, Contact hole 4, Contact plug 5, Opening 6, Interconnection 7, Interconnection 8, Hollow structure 9 and Sealing 10.

FIGS. 3(a) to (g) illustrate a process flow of another embodiment of a method of manufacturing a semiconductor device comprising a hollow structure as an interlayer insulator.

DETAILED DESCRIPTION OF THE PREFERRED EMBODIMENT

A preferred embodiment provides a method of processing a semiconductor substrate, comprising providing a semiconductor substrate disposed within a chamber, wherein the semiconductor substrate comprises a SiOF film and at least one other film, and selectively etching the SiOF film with a gas comprising HF. Preferably, the method uses a semiconductor manufacturing device comprising a chamber, a means for introducing gas to the chamber, and a means for removing gas from the chamber. Preferably, the gas used for selective etching is HF+$H_2O$, more preferably HF only, and etching is preferably conducted at a temperature in the range of about 25° C. to about 150° C. A preferred embodiment involves, as a pretreatment, a process of absorbing any moisture in the HF by bringing vapor-phase $H_2O$ inside the reaction chamber means and retaining it for a fixed period of time.

A fluorine-containing silicon oxide film (SiOF), preferably formed using a plasma CVD method, displays high hydrophobicity. Its hydroscopic quality is believed to result when $H_2O$ penetrates into pores in a film; hydrogen bonds with Si—OH and Si—F of $H_2O$; a hydrolysis reaction between $SiF_2$ and $H_2O$ takes place according to (m); and Si—OH and HF are formed in the film.

$$SiF_2 + H_2O \rightarrow F—Si—OH + HF \qquad (III)$$

It is believed that these $H_2O$ molecules do not desorb unless the temperature is about 150° C. (302° F.) or higher. An SiOF film has —OH groups and $H_2O$ molecules after absorbing moisture by taking in $H_2O$ molecules. HF is ionized with these —OH groups and $H_2O$ molecules reacting with HF gas brought in the reaction chamber, causing an etching reaction (IV):

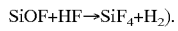

$$SiOF + HF \rightarrow SiF_4 + H_2).$$

$H_2O$ formed by the reaction formula (IV) further reacts with HF in the atmosphere, accelerating etching. As seen from the reaction formula (IV), an SiOF film absorbing moisture does not require $H_2O$ which was required for conventional oxidation films when etching. Consequently, by using only HF as an etching gas, etching of oxidation film types other than SiOF can be suppressed and selectivity can be improved. Because $SiF_4$ and $H_2O$, which are products of the reaction formula (IV), can be exhausted as gases after the etching is done without evacuating the inside of the reaction chamber, no residue or by-product is generated and rinsing with pure water after the etching is not required as well.

Additionally, by etching according to formula (IV) at a temperature in the range of from about room temperature (approximately 25° C. (77° F.)) to about 150° C. (302° F.), water vapor formed can reliquefy and adhere to other oxidation film types or the periphery, thus preventing etching of other oxidation film types or the periphery. Furthermore, when etching SiOF that is not absorbing moisture or insufficiently absorbing moisture, a pretreatment that involves bringing vapor-phase $H_2O$ into the reaction chamber and maintaining the state for a fixed period of time can be conducted to allow SiOF to absorb moisture. HF gas, then, can be introduced after evacuating the inside of the chamber and removing $H_2O$ adhering to the surface of other oxidation film types, etc.

Thus, in one aspect, the present invention provides high selectivity by using an SiOF film with hydrophobicity as a sacrificial film for etching. Experiments were conducted to confirm selectivity as described in the Examples below. A preferred etching device comprises a reaction chamber, a susceptor holding a semiconductor substrate horizontally inside the reaction chamber, a means for introducing gas to the inside the reaction chamber, and an exhausting means to exhaust gas from inside the reaction chamber. Preferably, the semiconductor substrate is heated by a sheath heater buried inside the susceptor. Further preferably, the semiconductor substrate is heated at a desired temperature while the inside of the reaction chamber is heated by a heater covering a reaction chamber outer wall at a second fixed temperature. The pressure inside the reaction chamber is preferably measured by a pressure gauge.

The Examples set forth below demonstrate that high selectivity can be obtained by using SiOF as a sacrificial film for etching, without etching NSG. Additionally, rinsing with pure water becomes unnecessary and selective etching can be performed, while maintaining high process stability without increasing the number of process steps. Furthermore, removal of a spontaneous oxidation film and selective etching can be performed in one device.

In a further preferred embodiment, a multilayer interconnection interlayer insulator in the form of a hollow structure is provided by using an SiOF film with hygroscopic property as a sacrificial film for selective etching. A method of manufacturing a semiconductor device that involves forming a multilayer interconnection interlayer insulator preferably includes a process of performing selective etching of an interlayer insulation film, more preferably using SiOF as the interlayer insulation film.

In a preferred embodiment, the method comprises
(a) forming an SiOF film layer on an interconnection,
(b) forming a cap film layer on the SiOF film layer,
(c) forming a contact hole passing through the cap film layer and the SiOF film layer,
(d) forming a contact plug so as to fill up the contact hole and reach the interconnection,
(e) forming an opening of a prescribed size in the cap film layer,
(f) forming an interconnection aligned on the contact plug,
(g) repeating the process flow of (a) to (f), preferably a prescribed number of times, to form a multilayer structure,
(h) selectively etching of the SiOF layers in the multilayer structure, and
(i) sealing the opening in the highest layer of the cap film layer.

Preferably, the cap film layer is either of polysilicon (polycrystal silicon), amorphous silicon, SiN, SiON, SiO, an organic film or a porous film. Preferably, the SiOF is selectively etched with HF or HF+$H_2O$, more preferably within the pressure range of about 1 to about 10 Torr. The opening in the cap film layer is preferably sealed by forming polysilicon on the opening using an Si selective growth method or by forming an $SiO_2$ film with poor step coverage using a plasma CVD method.

In a preferred embodiment, a method of manufacturing a semiconductor device comprises forming an interlayer insulator in the form of a hollow structure. A preferred method includes a process of performing selective etching of the interlayer insulation film, using SiOF as the interlayer insulation film.

Figure 3:
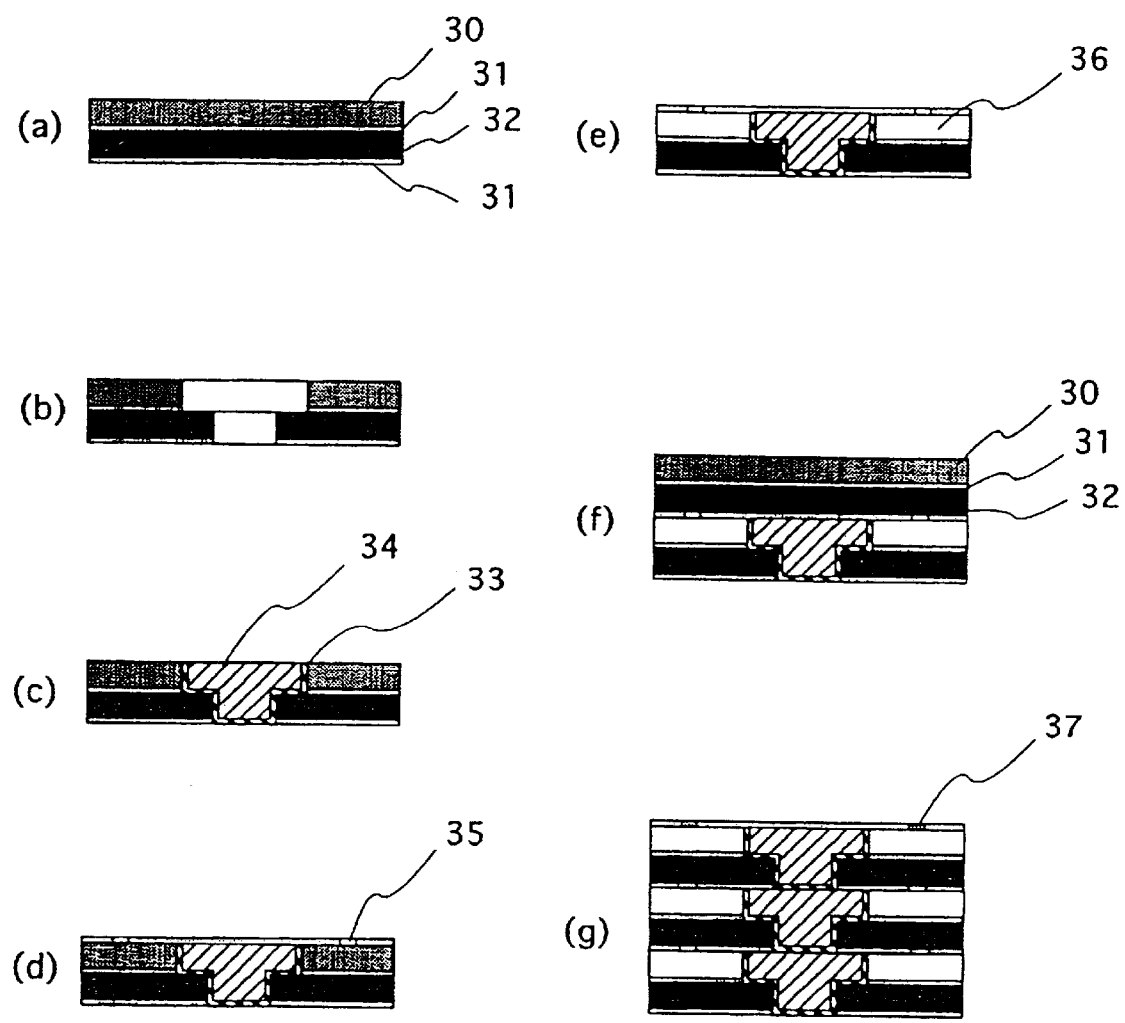

Preferred embodiments are illustrated in FIGS. 1–3. FIGS. 1(a) to (i) are cross sections illustrating a preferred method for forming a hollow structure in a semiconductor device. In FIG. 1(a), an SiOF film is formed on a lower interconnection 2. The SiOF film 1 is formed, preferably using monosilane ($SiH_4$), dinitrogen monoxide ($N_2O$), silane fluoride ($SiF_4$) and He or Ar gas as material gases and using a plasma CVD device. If interconnection materials are corroded by HF (for example, Al interconnection, etc.), a barrier layer is preferably formed.

In FIG. 1(b), a cap film 3 is then formed on the SiOF film 1. As a material for the cap film 3, polysilicon (polycrystal silicon), amorphous silicon, SiN, SiON, SiO, an organic film or a porous film can be used. As described below, other materials which can be made using an Si selective growth method can also be used.

In FIG. 1(c), a contact hole 4 is formed passing through the cap film layer 3 and the SiOF film layer 1. If an interconnection layout has a problem with strength if a hollow structure is used between the interconnections, a pattern for adding a filler is preferably formed simultaneously. In FIG. 1(d), a contact plug 5 is formed so as to fill up a contact hole 4 and to reach the interconnection 2. If a pattern accommodating a filler has been formed (FIG. 1(c)), the filler is preferably formed simultaneously. The same material as the contact plug is preferably used for the filler. The filler, however, is not used for electrically connecting the interconnections.

In FIG. 1(e), an opening 6 for etching a sacrificial film on the cap film 3 is formed. The opening 6 is formed, avoiding a region where the contact plug 5 or an upper interconnection (see FIG. 2(a)). The size and the number of the opening 6 are preferably selected according to the thickness, etc. of the sacrificial film (e.g., SiOF). It is preferable, however, that the size of the opening 6 is one quarter or less of the film thickness of the cap film in order to seal the opening later.

In FIG. 1(f), an upper interconnection 7 is formed being aligned with the top of the contact plug 5. In FIG. 1(g), by repeating the process flow illustrated in FIGS. 1(a) to (f) as shown, a multilayer interconnection (comprising 2, 7, and 8) using SiOF as an interlayer insulation film is formed.

In FIG. 1(h), a hollow structure 9 is formed by selectively etching every layer of the SiOF layer 1 using 100% HF, preferably at an HF pressure of about 1 to about 10 Torr (more preferably about 1 to about 5 Torr). $SiF_4$ and $H_2O$, etc. formed by the etching reaction are preferably gaseous and are removed without remaining on a semiconductor substrate.

In FIG. 1(i), the opening 6 of the highest layer of the cap film 3 is sealed (sealing 10) using an Si selective growth method. Preferably, polysilicon is grown on the opening 6 in a vacuum (approximately at 1–2 Pa when forming a film) at a temperature of about 300° C. to about 560° C. (about 572° F. to about 1040° F.), while introducing 200 sccm of monosilane ($SiH_4$). Alternatively, by forming an $SiO_2$ film on the highest layer of the cap layer 3 using a plasma CVD method with poor step coverage, the opening 6 can also be sealed.

FIG. 2(a) is a three-dimensional view of the positional relation of the opening 6 and the lower interconnection 2 (see FIG. 1(e)). FIG. 2(b) is a schematic cross section of a multilayer interconnection using a hollow structure as an interlayer insulator, which is formed by a preferred method as described herein. On each layer of the multilayer interconnection, a hollow structure 9 is formed as an interlayer insulator and the dielectric constant value between the interconnections infinitely approaches one.

FIG. 3 illustrates the process flow for another embodiment of a method of manufacturing a semiconductor device by forming an interlayer insulator comprised of a hollow structure according to the present invention. In FIG. 3(a), an SiO or SiN film is formed as a cap film 31 on the interlayer insulation film portion of a device. On this film, a low dielectric constant film 32 is formed. On this film, a cap film 31 is formed. Furthermore on this film, an SiOF film 30 is formed.

In FIG. 3(b), etching is performed so that the opening diameter of the cap film 31 and the low dielectric constant film 32 is less than the opening diameter of the cap film 31 and the SiOF film 30. In FIG. 3(c), a barrier metal film 33 for Cu interconnection is formed on the surface of the opening of shown in FIG. 3(b) using a TiN or Ta material. Furthermore, on this film, a Cu film is formed. After this, CMP is performed.

In FIG. 3(d), an opening 35 with the diameter of one quarter or less of the film thickness of the cap film is formed on the cap film by forming an SiO or SiN film having hydrophobicity for the second time as a cap film 31. The opening 35 is formed avoiding a region used for the interconnection and a contact hole. A void or hollow structure 36 is formed by selectively etching the SiOF film 30, as illustrated in FIG. 3(e).

In FIG. 3(f), an interlayer insulation film 32 with a low dielectric constant is formed on the cap film 31. Another cap film is formed and, on this film, an SiOF film 30 is formed. In FIG. 3(g), by repeating the process flow of FIGS. 3(b) to (f), a multilayer interconnection using an interlayer insulator comprised of a hollow structure is formed. The opening of the cap film in the highest step is sealed (sealing 37) using an Si selective growth method or a plasma CVD method with poor step coverage.

According to this embodiment, because the contact portion and the interconnection portion can be formed simultaneously, the number of processes decreases, and by creating a hollow structure and a low dielectric constant layer between interconnections, a multilayer interconnection structure with a low dielectric constant between the interconnections can be formed.

These embodiments provide a number of advantages. By using SiOF as a sacrificial film for etching, high selectivity can be obtained, forming a hollow structure in an interlayer insulator with a dielectric constant infinitely approaching one. Furthermore, by using a method according to the preferred embodiments, because a rinsing process with pure water becomes unnecessary and selective etching can be performed without leaving a residue and without increasing the number of processes, an interlayer insulator comprised of a hollow structure can be formed while maintaining high process stability.

In another preferred embodiment, the semiconductor substrate comprises at least two films, only one of which is etched. In more preferred embodiments, etching takes place in a semiconductor manufacturing device which comprises a reaction chamber means, gas-introducing means, an exhausting means and a pressure-regulating means. In this method, the etching comprises a process flow comprising bringing HF or HF+H$_2$O inside the reaction chamber by the gas-introducing means while exhausting the gases simultaneously by the exhausting means, and maintaining a pressure inside the reaction chamber at a fixed level by the pressure-regulating means to suppress a partial pressure rise in moisture. Preferably, the film that is etched is an SiOF film.

In another preferred embodiment, one selected film type of a multilayer film comprising at least two thin film types formed on a semiconductor substrate is etched. In this method, the etching comprises repeating a process flow comprising bringing in HF or HF+H$_2$O inside the reaction chamber by the gas-introducing means and maintaining the gas brought at a fixed pressure for a fixed period of time, and evacuating inside the reaction chamber by the exhausting means. In a further embodiment, the etching comprises setting a temperature of the semiconductor substrate at a temperature about 0° C. to about 50° C. (32 to 122° F.) higher than an inner wall temperature of the reaction chamber means.

A selective vapor-phase HF etching method according to a preferred embodiment is a method of processing a semiconductor substrate by etching only one selected thin film type from at least two types of thin films formed on the semiconductor substrate using a semiconductor manufacturing device comprising a reaction chamber means, gas-introducing means, an exhausting means and a pressure-regulating means. This embodiment is characterized in that the etching comprises a process flow comprising: bringing HF or HF+H$_2$O inside the reaction chamber by the gas-introducing means while exhausting the gases by the exhausting means simultaneously, and maintaining a pressure inside the reaction chamber at a fixed level by the pressure-regulating means to suppress a partial pressure rise in moisture. The sacrificial film is preferably an SiOF film, but films other than this (for example, PSG or a thermal oxidation film) can also be used. The film can be formed by various methods, including PE-CVD (plasma-excited CVD), thermal CVD, sputtering or SOG (Spin on Glass). A pressure-regulating means is preferably an N$_2$ balancer or a throttle valve, but other means can also be employed.

In this embodiment, HF is supplied to a reaction chamber means at a prescribed flow (about 10 to about 1000 sccm). At the same time, moisture (gas) formed by an etching reaction is exhausted by an exhausting means. At this time, a pressure inside the reaction chamber is regulated at a fixed pressure (about 1 to about 50 Torr) using an N$_2$ balancer or a throttle valve. In this way, a partial pressure rise in moisture formed by an etching reaction can be suppressed and re-condensation of moisture on a semiconductor substrate can be prevented.

Another preferred embodiment is a selective vapor-phase HF etching method. This embodiment provides a method of processing a semiconductor substrate by etching only one selected thin film type of a multilayer film comprising at least two types of thin films formed on the semiconductor substrate using a semiconductor manufacturing device comprising a reaction chamber means, gas-introducing means, and an exhausting means. This embodiment is characterized in that the etching comprises repeating several times a process flow comprising bringing HF or HF+H$_2$O inside the reaction chamber by the gas-introducing means, maintaining the gas at a fixed pressure for a prescribed period of time, and then evacuating by an exhausting means. A sacrificial film to be selected is preferably an SiOF film, but films other than this (for example PSG or a thermal oxidation film) can also be used. A method of forming the film is preferably PE-CVD (plasma-excited CVD), thermal CVD, sputtering or SOG (Spin on Glass), but methods other than these can also be used.

The methods described above are particularly valuable when etching a sacrificial film in the lower layer of a cap film formed on a semiconductor substrate by forming an opening on a cap film in an upper layer. HF can be brought into a reaction chamber at a fixed pressure (about 1 to about 50 Torr) and maintained for a prescribed period of time (about 1 to about 60 seconds, preferably about 30 to about 50 seconds). An etching reaction, then, takes place and the reaction chamber is evacuated immediately after a prescribed period of time elapses. By repeating this process flow several times, a partial pressure rise in moisture inside the multilayer film can be suppressed. At the same time, re-condensation of water, which is once evaporated, on a semiconductor substrate can be prevented. Furthermore, HF gas efficiency in contributing to etching can be improved.

A selective vapor-phase HF etching method according to a preferred embodiment is a method of processing a semiconductor substrate by etching only one selected thin film type from at least two types of thin films formed on the semiconductor substrate using a semiconductor manufacturing device comprising a reaction chamber means, gas-introducing means, and an exhausting means. Preferably, the temperature of the semiconductor substrate is about 0° C. to about 50° C. (32 to 122° F.) higher than an inner wall temperature of the reaction chamber means. The sacrificial film is preferably an SiOF film, but films other than this (for example PSG or a thermal oxidation film) can also be used. A method of forming the film is preferably PE-CVD (plasma-excited CVD), thermal CVD, sputtering or SOG (Spin on Glass), but methods other than these can also be used.

Preferably, the temperature of the semiconductor substrate is maintained in the range of from about 0° C. to about 50° C. (32 to 122° F.), preferably about 0° C. to about 30° C. (32° F. to 86° F.), higher than an inner wall temperature of a reaction chamber, by heating a susceptor on which a semiconductor substrate is loaded inside the reaction chamber means using a heater. During this time, an inner wall temperature of the reaction chamber is maintained at about 20° C. to about 200° C. (68 to 392° F.), preferably about 30° C. to about 150° C. (86° F. to 302° F.). In this case, the minimum value is preferably the vapor pressure temperature of water under the same pressure as that applied to HF brought in. Thus, by setting up an inner wall temperature of the reaction chamber and the semiconductor substrate temperature, re-condensation of water formed by etching on the semiconductor substrate or the inner wall of the reaction chamber is prevented.

The various embodiments provide a number of advantages, including improved selectivity, higher process stability, reduced production costs and increased yield.

It will be appreciated by those skilled in the art that various omissions, additions and modifications may be made to the methods and compositions described herein without departing from the scope of the invention, and all such modifications and changes are intended to fall within the scope of the invention as defined by the claims.

EXAMPLES 1–4

The etching device used in these experiments comprises a reaction chamber, a susceptor holding a semiconductor substrate horizontally inside the reaction chamber, means for introducing gas to the inside the reaction chamber, and means for removing exhaust gas from inside the reaction chamber. The semiconductor substrate is heated by a sheath heater buried inside the susceptor.

The relative etching of four films (see Table 1) was determined by the following method: The reaction chamber was first evacuated using the exhausting means. Next, HF gas was introduced by the gas-introducing means. The pressure of HF was maintained at 6 Torr for two minutes. During this time, the temperature of the semiconductor substrate was maintained at room temperature (approximately 25° C.77° F.). After that, the chamber was evacuated using the exhausting means, purged using $N_2$ gas introduced through the gas-introducing means, and evacuated again using the exhausting means. After repeating purging and evacuating the reaction chamber several times, the semiconductor substrate is removed from the reaction chamber. The result of selective etching by using the method according to this invention is shown in Table 1.

TABLE 1

| Example No. | Film composition | Amount etched (nm) | Selectivity |
| --- | --- | --- | --- |
| 1 | SiOF | 200 | — |
| 2 | Thermal oxidation film | 1 | 200 |
| 3 | CVD-SiO$_2$ | 2 | 100 |
| 4 | CVD-BSG | 4 | 50 |

These results demonstrate the high selectivity, e.g., SiOF/SiO$_2$=100 and BSG=50, obtained by using the etching method described above.

EXAMPLES 5–8

Selectivity was determined as a function of etching conditions in a series of experiments. The etching device used for these experiments is a conventional device comprising a reaction chamber, a susceptor holding a semiconductor substrate horizontally inside the reaction chamber, a gas-introducing means to bring an etching gas inside the reaction chamber, an exhausting means to exhaust the reaction chamber, a pressure-regulating means to regulate a pressure inside the reaction chamber and a heat insulating means to heat and maintain the temperature of the reaction chamber at a fixed temperature.

Films used for the experiments were an SiOF film formed by PE-CVD, an SiN film formed by CVD, an SiO$_2$ film formed by CVD, a BSG film, and a thermal oxidation film formed by CVD (see Table 3). Experiments were conducted as follows (see Table 2): First, the reaction chamber was evacuated by the exhausting means. Etching was performed under the respective conditions listed in Table 2 below. The reaction chamber was then evacuated by the exhausting means, purged using N$_2$ gas, and evacuated again. After purging and evacuating were repeated several times, the semiconductor substrate was removed from the reaction chamber and the amount of etching was measured.

Table 3 shows the selectivity of each film under the respective etching conditions, with the value for SiOF set equal to one. The reciprocal number of each value represents an etching amount. The results show that the selectivity of all film types was improved by approximately two times by practicing preferred embodiments of this invention, as compared with conventional examples. Thus, the moisture concentration inside the reaction chamber during the etching reaction was reduced to a low level and re-condensation on the semiconductor substrate was prevented. Additionally, if comparing Example 8 with other examples in Table 3, it can be seen that selectivity was improved as well. This indicates that solely preventing re-condensation on the semiconductor substrate achieves good results. Consequently, by combining Example 8 with Example 6 or Example 7, selectivity can be further improved. TABLE 2: ETCHING CONDITIONS

TABLE 2

ETCHING CONDITIONS

| Ex. No. | Temp. | HF pressure | Time | Comments |
| --- | --- | --- | --- | --- |
| 5C | RT | 6 Torr | 2 min. | HF was brought inside the reaction chamber and was maintained for 2 minutes |
| 6 | RT | 6 Torr | 2 min. | While bringing HF inside the reaction chamber, the reaction chamber was simultaneously exhausted and a pressure inside the reaction chamber was maintained at 6 Torr by a throttle valve. |
| 7 | RT | 6 Torr | 30 sec., 4 times | After bringing HF inside the reaction chamber and maintaining it for 30 seconds as it was, the reaction chamber was exhausted. This process flow was repeated four times. |
| 8 | 50° C. | 6 Torr | 2 min. | While heating a semiconductor substrate and the entire reaction chamber using a heater, HF was brought inside the reaction chamber and was maintained for two minutes |

C: Control
RT: Room temperature

TABLE 3

SELECTIVITY

| | Example 5C | Example 6 | Example 7 | Example 8 |
| --- | --- | --- | --- | --- |
| CYD-SiN film | 500 | >1000 | >1000 | >1000 |
| Thermal oxidation film | 200 | 600 | 500 | 700 |
| CVD-SiO$_2$ film | 100 | 240 | 200 | 280 |
| CVD-BSG film | 50 | 120 | 100 | 140 |

Note: Selectivity values expressed as ratios relative to SiOF, e.g. SiOF/CVD-SiO$_2$=240 for Example 6.

What is claimed is:

1. A method of processing a semiconductor substrate, comprising:
   providing a semiconductor substrate disposed within a chamber, wherein the semiconductor substrate comprises a SiOF film as a sacrificial layer and at least one other silicon oxide film, and
   selectively etching and removing the SiOF film rather than said at least one other silicon oxide film by placing said SiOF film and said at least one other silicon oxide film in contact with a gas comprising HF substantially without $H_2O$ added thereto to accomplish the selectivity.

2. The method of claim 1 wherein the gas further comprises $H_2O$.

3. The method of claim 1 which comprises selectively etching the SiOF film at a temperature in the range of about 25° C. to about 150° C.

4. The method of claim 1 wherein the chamber comprises an inner wall, which comprises selectively etching the SiOF film at a temperature about 0° C. to about 50° C. higher than the temperature of the inner wall.

5. The method of claim 1 wherein the chamber is equipped with a means for introducing the gas to the chamber, a means for removing the gas from the chamber, and a means for regulating the pressure of the gas in the chamber.

6. The method of claim 5 wherein the gas further comprises $H_2O$ and wherein the pressure in the chamber is maintained at a fixed level to suppress a partial pressure rise in water vapor.

7. The method of claim 5 wherein the etching comprises a process comprising introducing the gas to the chamber, maintaining the gas in the chamber at a fixed pressure for a fixed period of time, and removing the gas from the chamber.

8. The method of claim 5 wherein the chamber comprises an inner wall, which comprises selectively etching the SiOF film at a temperature about 0° C. to about 50° C. higher than the temperature of the inner wall.

9. The method of claim 8 wherein the etching further comprises repeating at least once the process comprising introducing the gas to the chamber, maintaining the gas in the chamber at a fixed pressure for a fixed period of time, and removing the gas from the chamber.

10. The method of claim 1 wherein the etching produces a hollow structure.

11. The method of claim 10 wherein the etching produces a semiconductor substrate comprising a multi-layer interconnection interlayer insulator.

12. A method of processing a semiconductor substrate, comprising:

providing a chamber comprised of an inner wall;

providing a semiconductor substrate disposed within the chamber, wherein the semiconductor substrate comprises a SiOF film as a sacrificial layer and at least one other silicon oxide film, and selectively etching and removing the SiOF film rather than said at least one other silicon oxide film by placing said SiOF film and said at least one other silicon oxide film in contact with a gas comprising HF at a temperature about 0° C. to about 500° C. higher than the temperature of the inner wall, said gas comprising substantially no $H_2O$ added thereto to accomplish the selectivity of the SiOF film rather than said at least one other silicon oxide film, by a process comprising introducing the gas to the chamber, maintaining the gas in the chamber at a fixed pressure for a fixed period of time, and removing the gas from the chamber.

* * * * *